(12) United States Patent
Wu

(10) Patent No.: US 8,169,029 B2
(45) Date of Patent: May 1, 2012

(54) HIGH VOLTAGE DEVICE WITH CONSTANT CURRENT SOURCE AND MANUFACTURING METHOD THEREOF

(75) Inventor: Wei-Kuo Wu, Guang Zhou (CN)

(73) Assignee: Nanker (Guan Zhou) Semiconductor Manufacturing Corp., Guan Zhou (CN)

( * ) Notice: Subject to any disclaimer, the term of this patent is extended or adjusted under 35 U.S.C. 154(b) by 56 days.

(21) Appl. No.: 12/490,992

(22) Filed: Jun. 24, 2009

(65) Prior Publication Data

US 2009/0315123 A1      Dec. 24, 2009

(30) Foreign Application Priority Data

Jun. 24, 2008   (CN) .......................... 2008 1 0028999

(51) Int. Cl.
*H01L 27/088*   (2006.01)
*H01L 21/336*   (2006.01)

(52) U.S. Cl. ............... 257/368; 257/401; 257/E29.027; 257/E29.122; 438/197

(58) Field of Classification Search ........... 257/402, 257/403, 409, 335, 337, 341, 343, 345, 339, 257/355, 392, 368, 401, E29.027, E29.122, 257/E21.627; 438/197
See application file for complete search history.

(56) References Cited

U.S. PATENT DOCUMENTS

| | | | | |
|---|---|---|---|---|
| RE28,704 E | * | 2/1976 | Robinson et al. | 438/217 |
| 5,428,241 A | * | 6/1995 | Terashima | 257/409 |
| 7,238,991 B2 | * | 7/2007 | Kuroda et al. | 257/355 |

* cited by examiner

*Primary Examiner* — Evan Pert
*Assistant Examiner* — Scott Stowe
(74) *Attorney, Agent, or Firm* — Babcock IP, PLLC

(57) ABSTRACT

A high voltage device with constant current source and the manufacturing method thereof. The device includes a P type silicon substrate (1), an oxide layer (6), a drain metal (2), a source metal (3), a gate metal (4), a P+substrate contact region (51), a N+drain region (52), an N+source region (53), an N−channel region (54) connecting the said N+drain region (52) and N+source region (53), and an N−drain region (92) enveloping the said N+drain region (52); the drain metal (2) fills drain through hole (82) and connects the N+drain region (52); the source metal (3) fills source through hole (83), and connects the N+source region (53) and P+substrate contact region (51); the source metal (3) and gate metal (4) are electrically connected by connecting metal (34). The manufacturing method includes steps of forming N+drain region, N+source region, N−drain region, P+substrate contact region, N−drain region and metal layer.

16 Claims, 13 Drawing Sheets

HIGH VOLTAGE DEVICE WITH CONSTANT CURRENT SOURCE AND MANUFACTURING METHOD THEREOF

BACKGROUND

1. Field of the Invention

This invention is related to a high voltage device with constant current source and the manufacturing method thereof, 2. Description of Related Art A metal-oxide-semiconductor field effect transistor (MOSFET) is a form of integrated circuit presently manufactured. Enhancement and depletion mode MOSFET devices are known. The enhancement mode MOSFET device is used in most cases. The depletion mode MOSFET device is basically composed of three parts, namely source (S), gate (G) and drain (D). An N–channel depletion mode MOSFET is adjacent to the gate surface, between the source and drain which are connected by a shallow doped layer with same polar. When the voltage between the gate and the source is positive, the saturated through current rises with the increase of voltage, which is similar to that of the enhancement mode MOSFET. When the gate and the source have same potential and the drain is imposed with positive voltage, the depletion mode MOSFET firstly passes through the linear zone where the current spikes and then arrives at the saturation region with through constant current. At this moment, the drain voltage is known as saturation voltage. The through current of the drain is related to the depth and concentration of the shallow doped layer, that is, the current increases when the depth and concentration increases. When the voltage between the gate and the source is negative, the channel may be intercepted and the through current is zero. Then the gate voltage is defined as cut-in voltage. However, it is impossible for the gate to intercept the channel current if the channel is extremely deep and with high concentration. For the drain and source current is in a state of constant through current when the gate and source voltages are zero, the depletion mode MOSFET is not utilized as conveniently as the enhancement mode MOSFET, that is why it is not manufactured alone by the industry. The depletion mode MOSFET can be used as a constant current source just because it gets through when the gate voltage is zero and the current is almost placed in the saturation region until avalanche breakdown when the drain voltage increases. If the working voltage (i.e. avalanche voltage) range of the depletion mode MOSFET is enhanced to more than 50V, the depletion mode MOSFET can be used widely as the constant current source for the overvoltage protection of DC load connected to AC supply after rectification and filtration. If the avalanche voltage of the drain of the depletion mode MOSFET is within 15V, it can be used as low voltage constant current source of DC supply, such as the constant current source of a Light Emitting Diode (LED) mining lamp.

In practical application, despite low power consumption, most loads require that the supplied current and voltage supply must be stable within a range and can provide protection for part elements of the load. To solve this problem, a constant current or stabilized voltage supply for the load is typically applied. Meanwhile, it is needed to add overcurrent protection for some elements of the load in the circuit under abnormal condition, which results in more components, a complicated circuit and higher percentage of consumed extra power of the supply.

Now, with the wider application of the LED, the LED lamp for lighting indoors and outdoors becomes more popular. The existing LED drive circuit is necessarily provided with a constant current circuit which has many peripheral devices increase cost even if the LED has stable illumination and low luminance fluctuation. Moreover, compared with the power consumed by the LED, the extra power consumed by the peripheral circuit makes up more percentage. Usually, the loss power accounts for 20-30% of the total power, which causes the LED have less than optimal energy saving.

SUMMARY OF THE INVENTION

LED circuit efficiency is increased if there is a high voltage device with constant current source which is series-wound with the LED lamp. To overcome the weak point of existing technology, the invention claims a high voltage device with constant current source, which can be directly applied to AC/DC supply and with function of overcurrent and overvoltage protection. When applied to LED circuit, it is able to improve the power consumption of the whole circuit.

The invention also claims a method of manufacturing the high voltage device with constant current source.

The technology adopted for the high voltage device with constant current source is as follows: The high voltage device with constant current source includes a P type silicon substrate, oxide layer formed on the front face of said silicon substrate, a drain metal, a source metal, and a gate metal which are formed on the front face of said oxide layer, a P+substrate contact region, an N+drain region, an N+source region which are implanted in said silicon substrate, an N–channel region connecting said N+drain region and N+source region, and an N–drain region enveloping said N+drain region; several drain through holes and source through holes are formed on the oxide layer; the drain metal fills the drain through holes and connects the N+drain region; the source metal fills the source through holes, and connects the N+source region and P+substrate contact region; the source metal and gate metal are electrically connected by a connecting metal.

The high voltage device with constant current source also includes an N–source region enveloping said N+source region.

The high voltage device with constant current source also includes a P+channel protective region separating said N–channel region from silicon substrate.

There is a heat sink plane made of at least one metal layer(s) on the back of the silicon substrate.

Said drain metal, the source metal and gate metal are made of aluminum, copper or silicon-aluminum alloy.

The technology adopted for manufacturing the high voltage device with constant current source is composed of the steps as follows:

(a) Formation of oxide layer protection film: Conducting thermal oxidation of P type silicon substrate in oxidation furnace through wet oxidation to grow the first oxide layer with a thickness of 1000-3000 Å, so as to form oxide layer protection film;

(b) Formation of N+drain region, N+source region, N–drain region and N–source region: Executing photoetching on the photoetching machine with the third N+photomask; etching the first oxide layer with corrosive liquid with HF; implanting arsenic ion in the silicon substrate through ion implantation; doping impurity phosphorus on the front face of the silicon substrate in high temperature diffusion furnace or implanting the impurity phosphorus in the silicon substrate through ion implantation; driving the phosphorus and arsenic ion under high temperature to form, with different diffusion velocity of the phosphorus and arsenic ion, N+drain region and N+source region that are mainly formed by the arsenic ion, N−drain region and N−source region that are mainly formed by the phosphorus; meanwhile forming a second oxide layer; Or alternatively directly forming N+drain region, N+source region and N−drain region when there is no N−source region: Executing photoetching on the photoetching machine with the first N+photomask; etching the first oxide layer with corrosive liquid with HF; doping impurity phosphorus on the front face of the silicon substrate in high temperature diffusion furnace or implanting the impurity phosphorus in the silicon substrate through ion implantation; executing photoetching on the photoetching machine with the second N+photomask; then etching the first oxide layer with corrosive liquid with HF; implanting arsenic ion in the silicon substrate through ion implantation; driving the phosphorus and arsenic ion under high temperature to form, with different diffusion velocity of the phosphorus and arsenic ion, N+drain region and N+source region that are mainly formed by the arsenic ion, and N−drain region that is mainly formed by the phosphorus; meanwhile forming a second oxide layer;

(c) Formation of P+substrate contact region: Executing photoetching on the photoetching machine with the P+photomask; etching the first and second oxide layers with corrosive liquid with HF; implanting boron ion or P type boron difluoride impurity in the silicon substrate through ion implantation; then driving under high temperature to form said P+substrate contact region; meanwhile forming a third oxide layer;

(d) Formation of gate oxide layer: Executing photoetching on the photoetching machine with the gate oxide layer photomask; etching the first, second and third oxide layers with corrosive liquid with HF; conducting thermal oxidation of said silicon substrate in oxidation furnace through dry or wet oxidation to grow the fourth oxide layer with a thickness of 500-2000 Å, so as to form gate oxide layer;

(e) Formation of N−channel region: Implanting the phosphorus in the silicon substrate between N+drain region and N+source region through ion implantation; driving the phosphorus and arsenic ion under high temperature to form; then tempering to form said N−channel region;

Or firstly implanting boron ion in the silicon substrate between N+drain region and N+source region through ion implantation when there is P+channel protective region; then implanting the phosphorus in the silicon substrate between N+drain region and N+source region through ion implantation; finally tempering to form said N−channel region and P+channel protective region;

(f) Formation of metal layer: Executing photoetching on the photoetching machine with contact hole photomask; etching the fourth oxide layer to form said drain and source through holes; then depositing metal layer by sputtering or vapour deposition; next executing photoetching on the photoetching machine with metal layer photomask; etching the metal layer to form said drain metal, source metal, gate metal and connecting metal;

(g) Formation of heat sink plane: Reducing the back of the silicon substrate by grinding; then depositing an aluminium metal layer or several metal layers containing titanium, nickel and silver by sputtering or vapour deposition on the back of the silicon substrate, so as to form the heat sink plane.

The advantages of the invention are as follows: The high voltage device with constant current source includes a P type silicon substrate, an oxide layer formed on the front face of said silicon substrate, a drain metal, a source metal, a gate metal which are formed on the front face of said oxide layer, a P+substrate contact region, an N+drain region and an N+source region in said silicon substrate, an N−channel region connecting said N+drain region and N+source region, and an N−drain region enveloping said N+drain region; several drain through holes and source through holes are formed on the oxide layer; the drain metal fills the drain through holes and connects the N+drain region; the source metal fills the source through holes, and connects the N+source region and P+substrate contact region; the source metal and gate metal are electrically connected by a connecting metal. Therefore, the high voltage device with constant current source forms a depletion mode MOSFET which is still kept in a state of getting through when the gate is without voltage to function as an independent high voltage device with constant current source. It is convenient instead of the current peripheral constant voltage and current circuit to reduce the elements and simplify the circuit. Especially, the N−drain region enhances the electrical isolation between the N+drain region and the silicon substrate to further the high voltage resistance of the device. In series connection with load (i.e. LED assembly) with over voltage and overcurrent protection, the high voltage device with constant current source can be directly applied to AC/DC supply. For example, when applied to LED circuit, it is able to save the power consumption of the whole circuit.

The high voltage device with constant current source also consists of an N−source region enveloping the N+source region, which further enhances the electrical isolation between the N+drain region and the silicon substrate and can form the N+source region, N+drain region, N−source region and N−drain region at the same time to reduce the process. Thus, the high voltage device with constant current source has better performance and simpler manufacturing process.

The high voltage device with constant current source further consists of P+channel protective region separating the N−channel region and the silicon substrate to prevent creepage between the N−channel region and the silicon substrate, which further improves the stability of the device. Thus, the high voltage device with constant current source still has better performance.

Similarly, the high voltage device with constant current source manufactured by the method has advantages above mentioned. In addition, this method makes process simple and guarantees high quality product.

DETAILED DESCRIPTION

Embodiment 1

Figure 1:
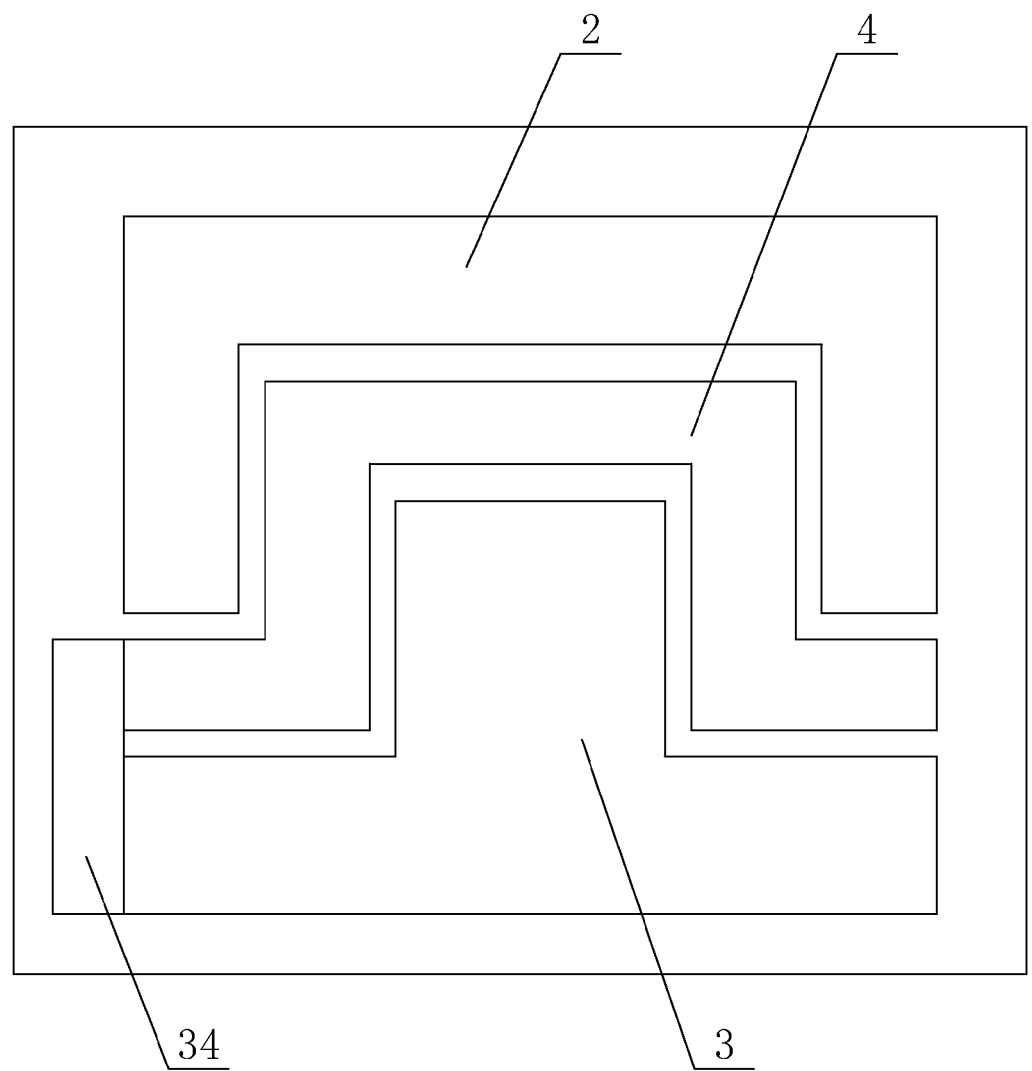
FIG. 1: Drawing of the facade of the high voltage device with constant current source.
Figure 2:
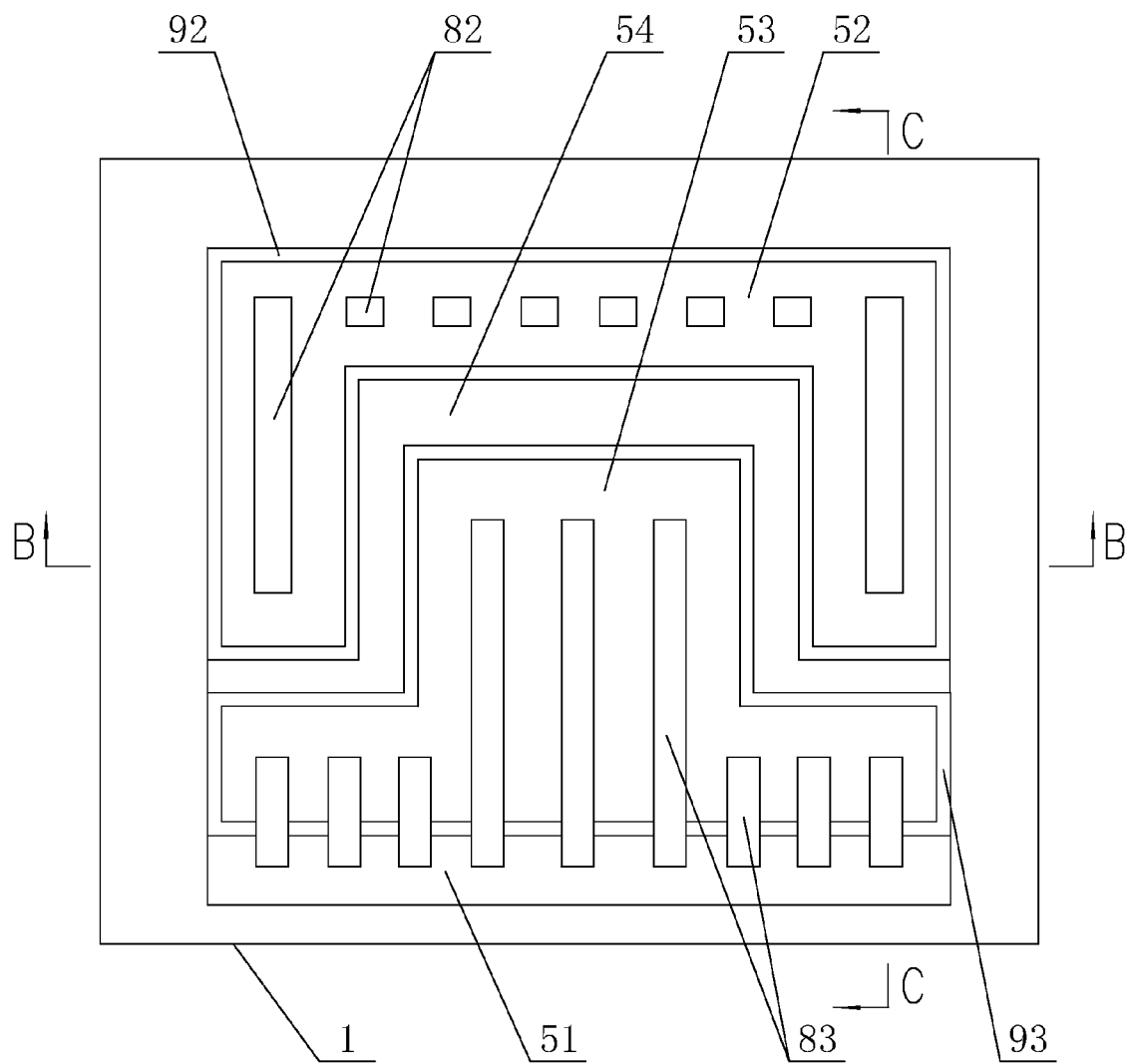
FIG. 2: Drawing of A-A section of high voltage device with constant current source of the embodiment 1 seen in FIG. 3.
Figure 3:
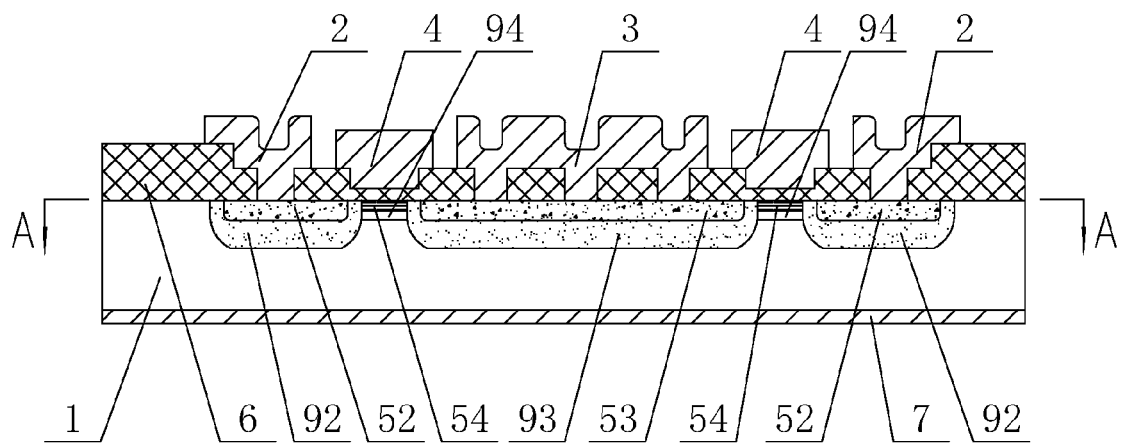
FIG. 3: Drawing of B-B section of high voltage device with constant current source of the embodiment 1 seen in FIG. 2.

As shown in FIGS. 1-4, the high voltage device with constant current source of embodiment 1 includes a P type silicon substrate 1, oxide layer 6 formed on the front face of the silicon substrate 1, drain metal 2, source metal 3, gate metal 4 which are formed on the front face of the oxide layer 6, P+substrate contact region 51, N+drain region 52 and N+source region 53 which are implanted in the silicon substrate 1, N−channel region 54 connecting N+drain region 52 and N+source region 53, N−drain region 92 enveloping N+drain region 52, N−source region 93 enveloping N+source region 53 and P+channel protective region 94 separating N−channel region 54 and the silicon substrate 1; the P+substrate contact region 51 enhances the ohmic contact between the source metal 3 and silicon substrate 1; the P+channel protective region 94 can prevent creepage between the N−channel region 54 and the silicon substrate 1 to further enhance the stability of this device; several drain through holes 82 and source through holes 83 are formed on the oxide layer 6; the drain metal 2 fills the drain through holes 82 and connects N+drain region 52; the source metal 3 fills the source through holes 83, and connects N+source region 53 and P+substrate contact region 51; the source metal 3 and gate metal 4 are electrically connected by connecting metal 34. There is also heat sink plane 7 made of titanium, nickel and silver material or an aluminum metal layer on the back of the silicon substrate 1; the drain metal 2, source metal 3 and gate metal 4 are made of aluminum, or it may be copper or silicon aluminum alloy.

The high voltage device with constant current source forms a depletion mode MOSFET which is still kept in a state of getting through when the gate is without voltage to function as an independent high voltage device with constant current source. It is convenient instead of the prior peripheral constant voltage and current circuit. Especially, the N−drain region 92 enhances the electrical isolation between the N+drain region 52 and the silicon substrate 1 to further the high voltage resistance of the device. In comparison with the device without said N−drain region 92 and N−source region 93, the high voltage resistance of the high voltage device with constant current source is raised from 20V to 40V in the range of the constant flow of the current; when it is beyond 40V, due to the temperature characteristic of MOS transistor that the current will decrease under high temperature, it can still be increased to more than 50V although the slope of the voltage curve changes greatly. As a result, this device can be applied to circuit and absolutely to an LED series circuit in which the drain avalanche voltage is improved to more than 60V.

It is understood that the silicon substrate 1 may be N type, but the polar is different. For instance, P+substrate contact region 51 is changed into N+substrate contact region, N+drain 52 into P+drain, N+source 53 into P+source, N−channel region 54 into P−channel region, N−drain 92 into P−drain, N−source 93 into P−source, and P+channel protective region 94 into N+channel protective region. In such case, it has the same characteristics of the invention.

Figure 5:
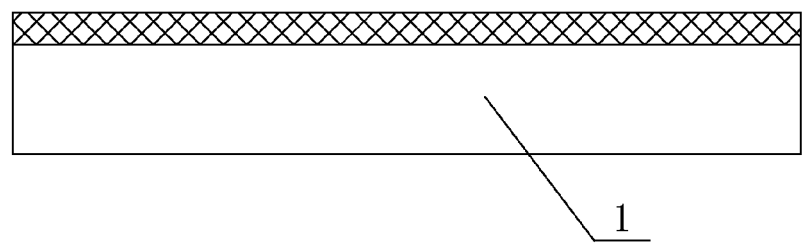
FIG. 5: Drawing of the section after step (a) of the high voltage device with constant current source of the embodiment 1 and 2.
Figure 6:
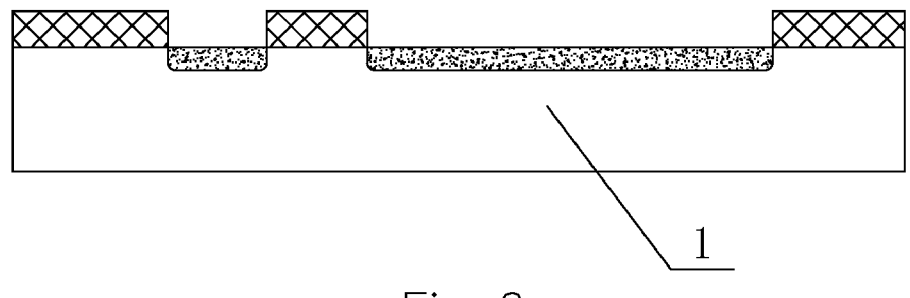
FIGS. 6 and 7: Drawing of the section during step (b) of the high voltage device with constant current source of the embodiment 1.

A shown in FIGS. 4-13, the steps of manufacturing the high voltage device with constant current source of this embodiment 1 are as follows:

(a) Formation of oxide layer protection film: Conducting thermal oxidation of P type silicon substrate 1 in oxidation furnace under 900-1100° C. through wet oxidation to grow the first oxide layer with a thickness of 2000 Å (controlled within a range of 1000-3000 Å), so as to form oxide layer protection film; finally, the section is illustrated in FIG. 5.

Figure 7:
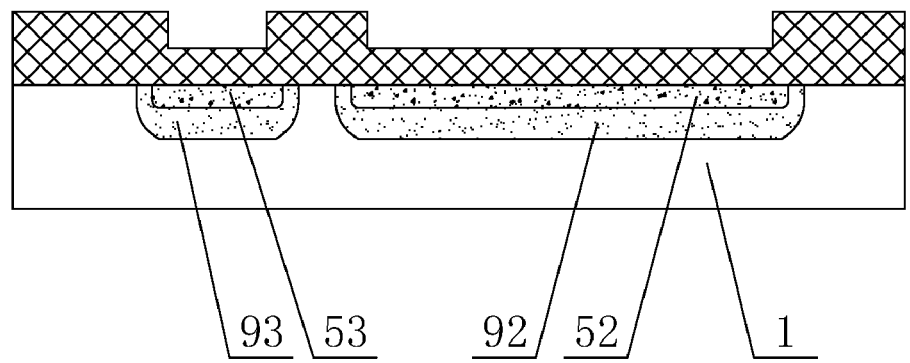

(b) Formation of N+drain region, N+source region, N−drain region and N−source region: Executing photoetching on the photoetching machine with the third N+photomask; etching the first oxide layer with corrosive liquid with HF; implanting $1\times10^{15}$-$1\times10^{16}$/cm$^2$ N type impurity arsenic ion in the silicon substrate 1 through ion implanter with an energy of 40-100 keV; implanting $1\times10^{13}$~$5\times10^{15}$/cm$^2$ N type impurity phosphorus in the silicon substrate 1 through ion implantation with an energy of 40-160 keV; shown in FIG. 6, or doping phosphorus on the front face of the silicon substrate 1 in high temperature diffusion furnace; then driving the phosphorus and arsenic ion under 1000~1200° C. to form, for the diffusion velocity of the phosphorus is faster than that of arsenic ion while the quantity is more than that of arsenic ion, N+drain region 52 and N+source region 53 that are mainly formed by the arsenic ion, N−drain region 92 and N−source region 93 that are mainly formed by the phosphorus, so as to improve the voltage between the drain and source; the N−drain region 92 and N−source region 93 are controlled with a depth of 3-10 microns; meanwhile forming the second oxide layer which is 2000~8000 Å in thickness; finally, the section is illustrated in FIG. 7.

Figure 8:
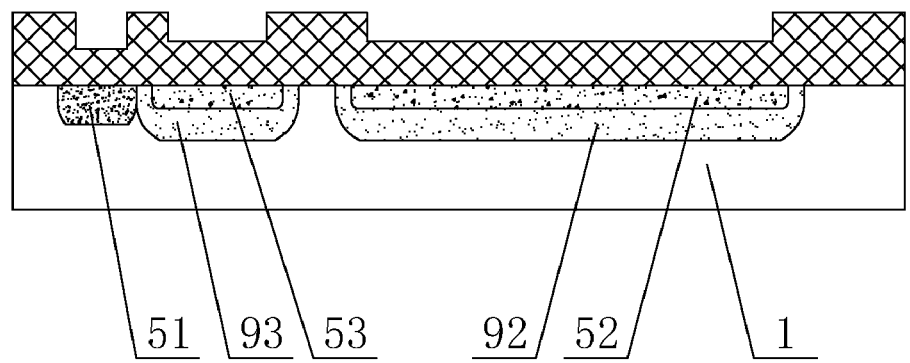
FIG. 8: Drawing of the section after step (c) of the high voltage device with constant current source of the embodiment 1.

(c) Formation of P+substrate contact region: Executing photoetching on the photoetching machine with the P+photomask; etching the first and second oxide layers with corrosive liquid with HF; implanting $1\times10^{14}$~$5\times10^{15}$/cm$^2$ boron ion or boron difluoride in the silicon substrate 1 through ion implantation with an energy of 40-160 keV; then driving under a high temperature of 1000~1200° C. to form said P+substrate contact region 51; meanwhile forming the third oxide layer with a thickness of 1000~5000 Å; finally, the section is illustrated in FIG. 8.

Figure 9:
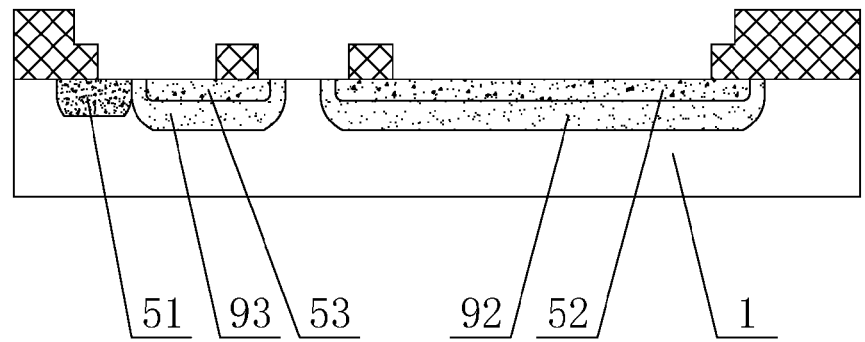
FIGS. 9 and 10: Drawing of the section during step (d) of the high voltage device with constant current source of the embodiment 1.
Figure 10:
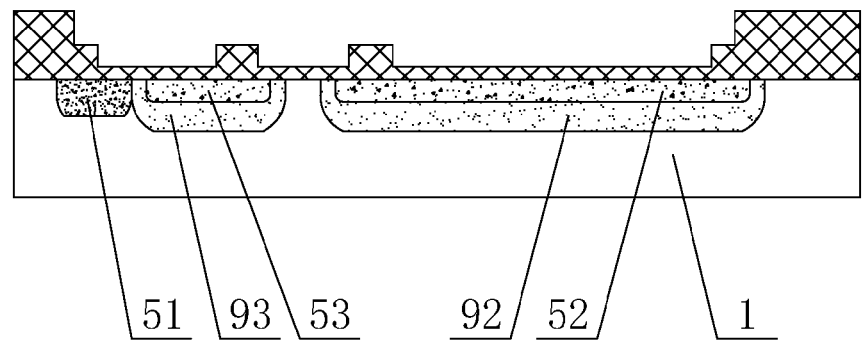

(d) Formation of gate oxide layer: Executing photoetching on the photoetching machine with the gate oxide layer photomask; etching the first, second and third oxide layers with corrosive liquid with HF as shown in FIG. 9; conducting thermal oxidation of said silicon substrate 1 in oxidation furnace under 850~1000° C. through dry or wet oxidation to grow the fourth oxide layer with a thickness 1000 Å (controlled within a range of 500-2000 Å), so as to form gate oxide layer; finally, the section is illustrated in FIG. 10.

Figure 11:
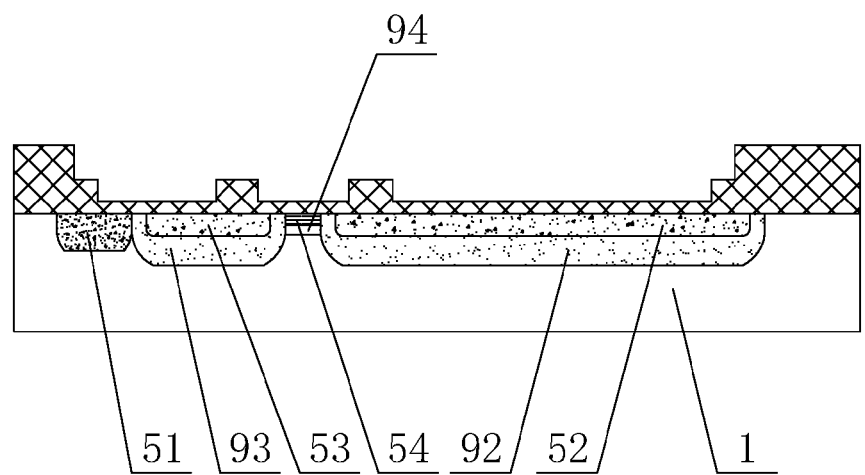
FIG. 11: Drawing of the section after step (e) of the high voltage device with constant current source of the embodiment 1.

(e) Formation of N−channel region: Implanting $1\times10^{11}$~$1\times10^{12}/cm^2$ boron ion in the silicon substrate 1 between N+drain region 52 and N+source region 53 through ion implantation with an energy of 60-200 keV; then implanting $1\times10^{11}$~$1\times10^{13}/cm^2$ phosphorus in the silicon substrate 1 between N+drain region 52 and N+source region 53 through ion implantation with an energy of 40-200 keV; next, tempering to form said N−channel region 54 and P+channel protective region 94; implanting the boron ion is to enhance the concentration of the substrate under the channel to prevent creepage between the drain and source where only surface channel can be gotten through, so the boron ion is usually with more quantity than the phosphorus to ensure the boron ion is deposited beneath the phosphorus after driving; finally, the section is illustrated in FIG. 11.

Figure 12:
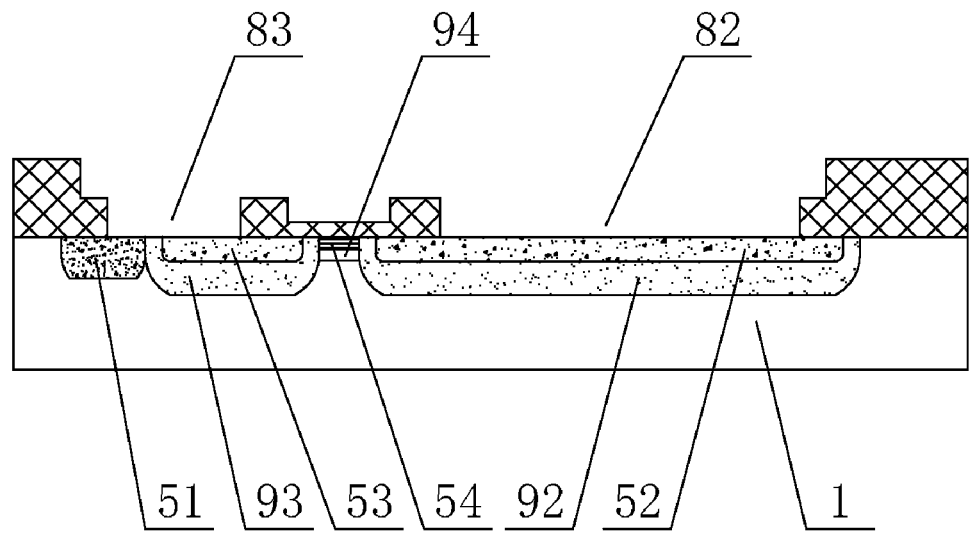
FIGS. 12 and 13: Drawing of the section during step (f) of the high voltage device with constant current source of the embodiment 1.
Figure 13:
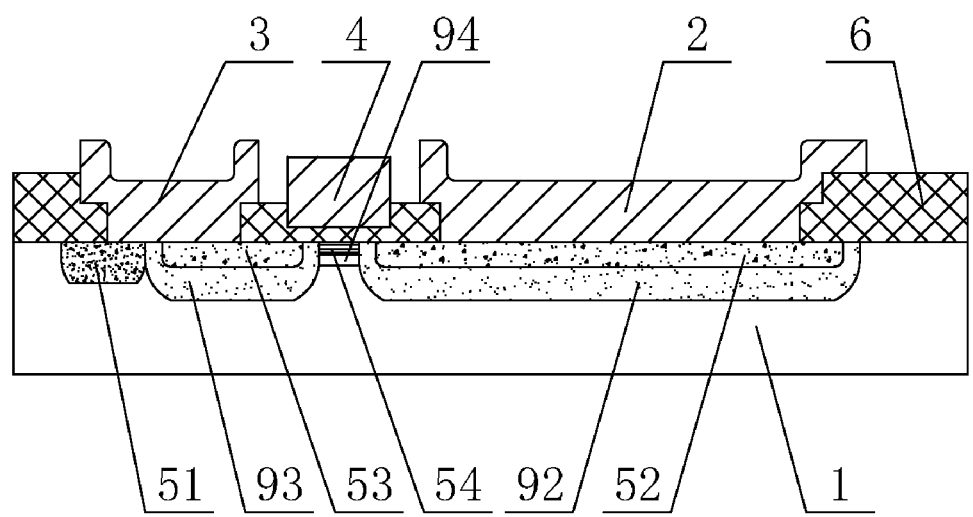

(f) Formation of metal layer: Executing photoetching on the photoetching machine with contact hole photomask; etching the fourth oxide layer to form said drain through hole 82 and source through hole 83 as shown in FIG. 12; then depositing metal layer of 10000 Å thickness (controlled within a range of 5000-30000 Å) by sputtering or vapour deposition; next executing photoetching on the photoetching machine with metal layer photomask; etching the metal layer to form said drain metal 2, source metal 3, gate metal 4 and connecting metal 34; finally, the section is illustrated in FIG. 13.

Figure 4:
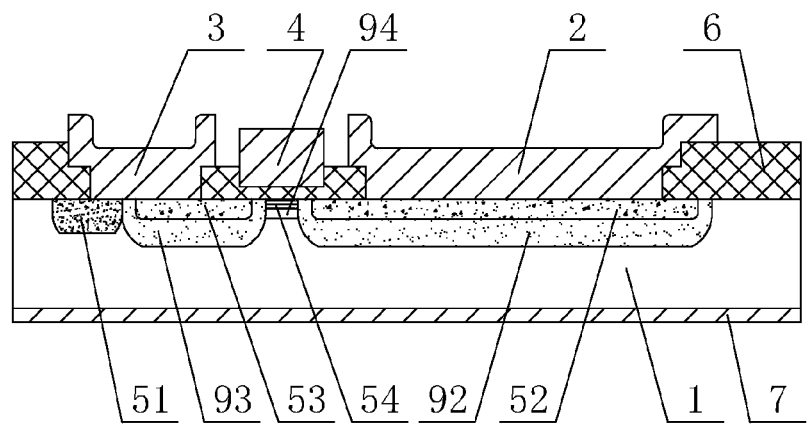
FIG. 4: Drawing of C-C section of high voltage device with constant current source of the embodiment 1 seen in FIG. 2.

(g) Formation of heat sink plane: Reducing the silicon substrate 1 by grinding the back thereof from 400~650 to 200~250 microns to improve the capability of heat dissipation; then depositing an aluminium metal layer or several metal layers containing titanium, nickel and silver by sputtering or vapour deposition on the back of the silicon substrate 1, so as to form the heat sink plane 7; finally, the section is illustrated in FIG. 4.

Figure 14:
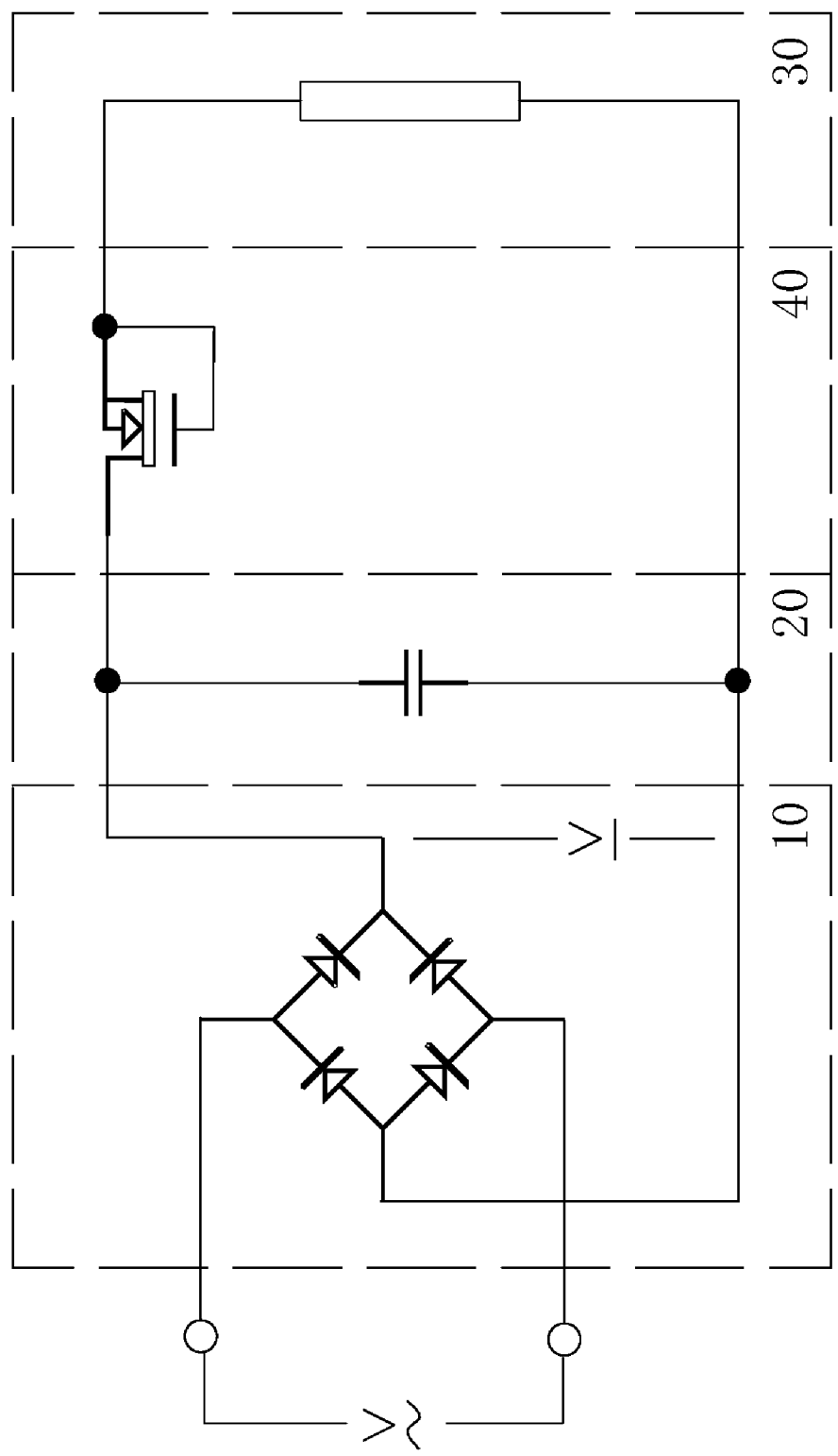
FIG. 14: Drawing of one application circuit of the high voltage device with constant current source.

An application circuit of the high voltage device with constant current source is shown in FIG. 14, which is composed of a rectification circuit 10, a filter capacitor 20 and a load 30, as well as a depletion mode MOSFET 40 (i.e. the high voltage device with constant current source). The AC input end of the rectification circuit 10 is connected to AC supply; the DC output end of the rectification circuit 10 is in series connection to the filter capacitor 20; the drain of the depletion mode MOSFET 40 is connected to one end of the DC output end of the rectification circuit 10; the source and gate of the depletion mode MOSFET 40 are in parallel connection, and connected to one end of the load 30 which is LED assembly or lamps made of several LED in series or parallel connection. In practical application, a series of LED may be firstly in series connection while the total withstand voltage is approximate to and less than the DC voltage after rectification and filtration, then connect the anode of the LED assembly in series connection to the source/gate of the high voltage device with constant current source of which the drain is connected to the positive voltage after rectification and filtration. Alternatively, the high voltage device with constant current source is series-wound with the cathode of the LED assembly whose anode is connected to the DC output end of the rectification circuit 10, that is to say, the load 30 and the depletion mode MOSFET 40 exchange places. The saturation current of the high voltage device with constant current source can be adjusted according to the current of the LED assembly when the gate and source have same potential. Thus, it is able to supply constant current to the LED assembly. Moreover, when the AC voltage is unstable, especially when it exceeds the normal voltage, the additional voltage will be imposed between the drain and source of the high voltage device with constant current source but not to affect the LED assembly, as a result of protecting the LED assembly by stabilized voltage. If AC voltage is less than the normal voltage, it will first reduce the voltage to a value between the drain and source of the high voltage device with constant current source, then the surplus will be shared by the LED assembly equally, which will lead to reduction of the current through LED but neither cause damage to the LED nor cause indispensable power consumption, therefore, it can realize the purpose of energy saving by the LED assembly. For a white light LED working at 3.2V/30 mA, if 96 LEDs are connected in series, the total voltage is 307.2V while 220V AC voltage outputs 311V after rectification and filtration. That is, when the drain of the high voltage device with constant current source whose output current is 30 mA is connected to the output end after rectification and filtration, the source and gate are connected to the anode of the LED assembly, the voltage between the drain and source of the high voltage device with constant current source will be up to 3.38V, and the power consumption of the whole circuit will reach about 9.33 W (96×3.2×0.03+3.88×0.03), yet the high voltage device with constant current source only consumes 0.116 W (3.88×0.03) which makes up 1.2% of the total power consumption. Because the AC voltage fluctuates ±30V and the DC voltage after rectification and filtration fluctuates ±45V, the high voltage device with constant current source can have a function of over voltage protection of the LED assembly under condition of unstable AC supply voltage when the withstand voltage of the high voltage device with constant current source is up to more than 45V. When applied to LED circuit, this device is able to save the power consumption of the whole circuit. The load 30 may be an electronic circuit or DC motor with high working voltage, even an electric load with high resistance, etc. When applied to LED circuit, the device has advantages above mentioned.

Figure 15:
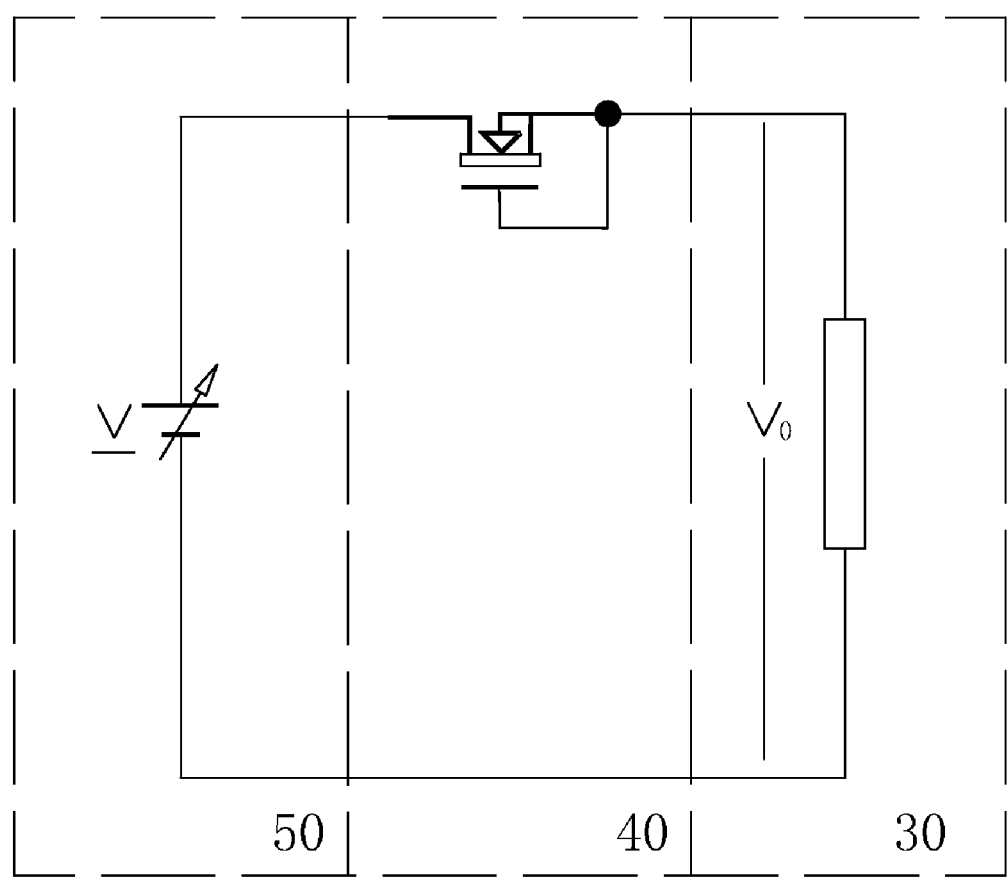
FIG. 15: Drawing of an alternative application circuit of the high voltage device with constant current source.
Figure 16:
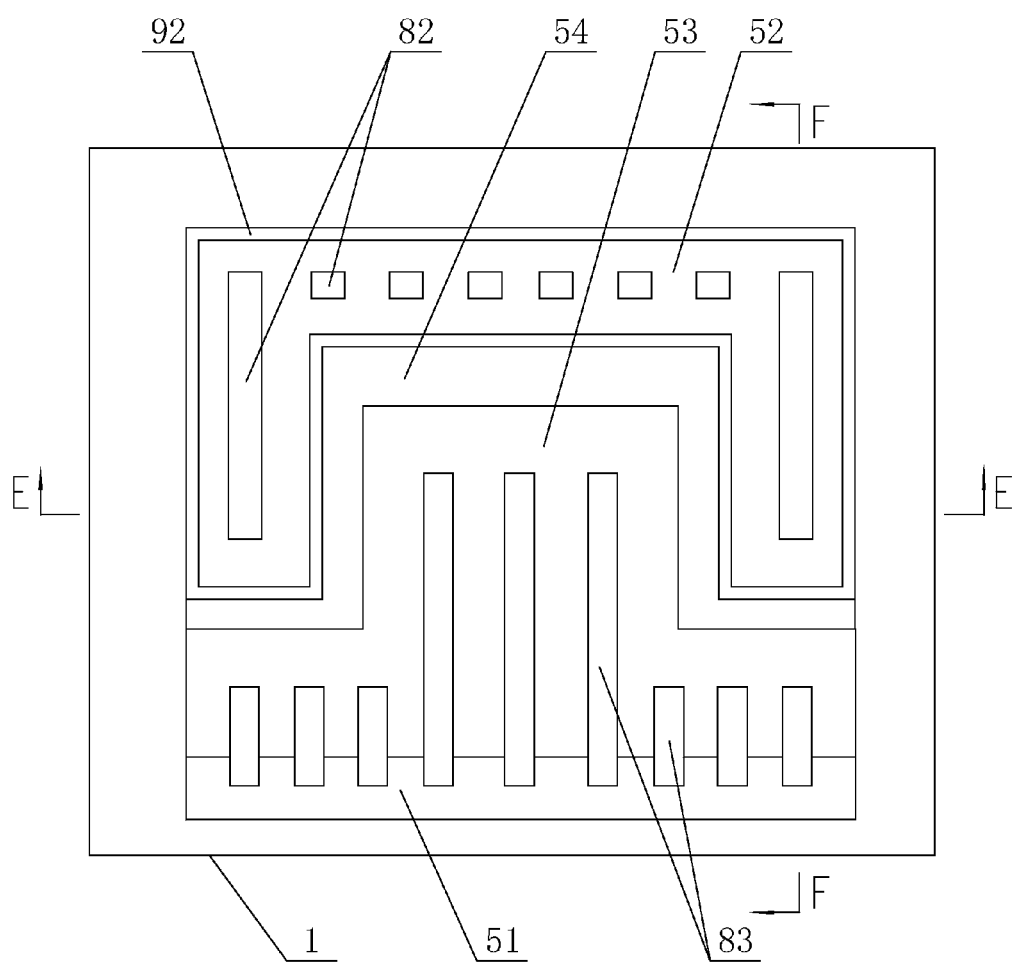
FIG. 16: Drawing of D-D section of high voltage device with constant current source of the embodiment 2 seen in FIG. 17.
Figure 17:
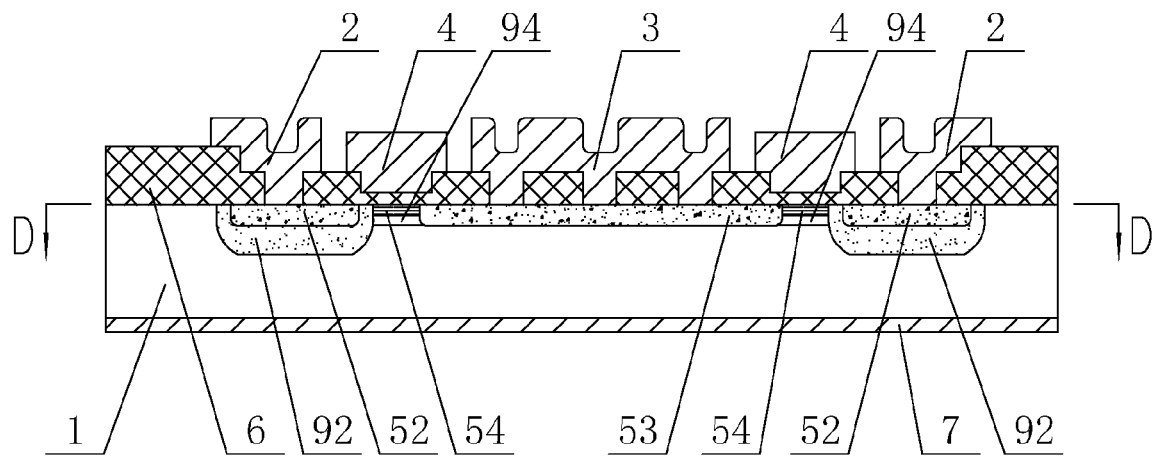
FIG. 17: Drawing of E-E section of high voltage device with constant current source of the embodiment 2 seen in FIG. 16.
Figure 18:
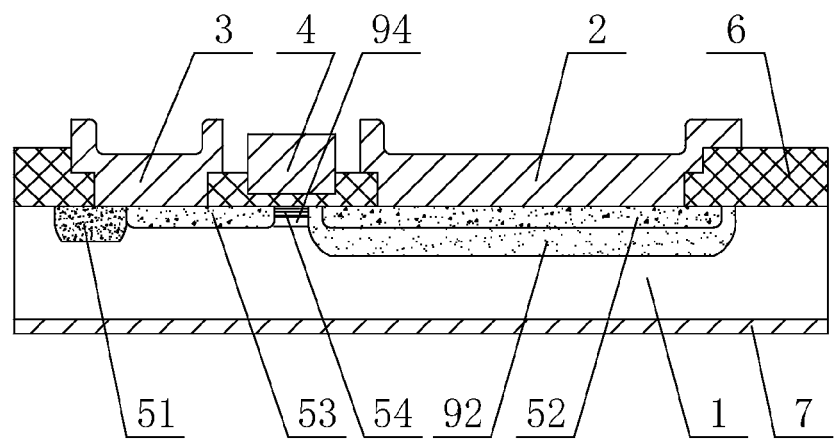
FIG. 18: Drawing of F-F section of high voltage device with constant current source of the embodiment 2 seen in FIG. 16.

An alternative application circuit of the high voltage device with constant current source is shown in FIG. 15, which is composed of a fluctuant DC supply 50, a load 30 made of LED assembly as well as a depletion mode MOSFET 40 (i.e. the high voltage device with constant current source). The anode input end of the fluctuant DC supply 50 is connected to the drain of the high voltage device with constant current source; the source and gate of the high voltage device with constant current source are connected to the anode of the load 30 of which the cathode is connected to the cathode of the DC supply 50. Normally, the saturation voltage of N−type depletion mode MOSFET is 1-3V. However, when the output voltage of the DC supply 50 fluctuates between $(1.0+V_0)$ and $(0.8\times V_{avalanche\ voltage}+V_0)$, the high voltage device with constant current source can protect LED load.

Embodiment 2

As shown in FIGS. 1, 16, 17 and 18, the high voltage device with constant current source of this embodiment 2 is different from that of embodiment 1 as follows: The high voltage device with constant current source of this embodiment 2 is without N−source 93 enveloping said N+source 53 but with the N−drain 92 enveloping said N+drain 52, which facilitates simpler structure for the high voltage device with constant current source of this embodiment 2.

Figure 19:
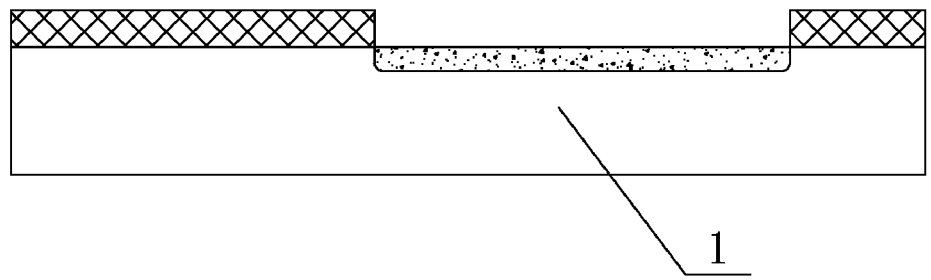
FIGS. 19, 20 and 21: Drawing of the section during step (b) of the high voltage device with constant current source of the embodiment 2.
Figure 20:
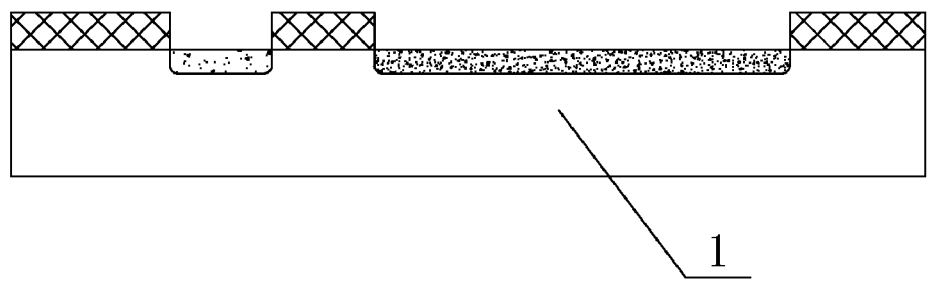
Figure 21:
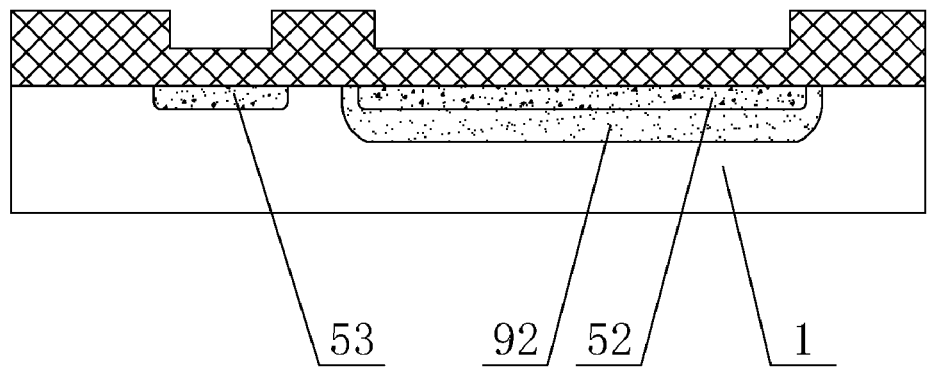
Figure 22:
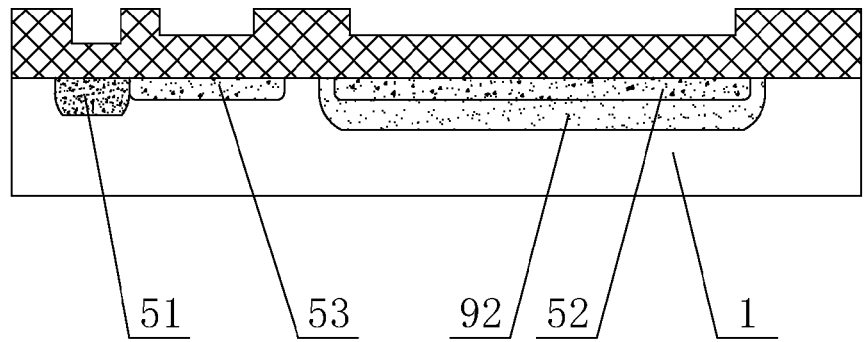
FIG. 22: Drawing of the section after step (c) of the high voltage device with constant current source of the embodiment 2.
Figure 23:
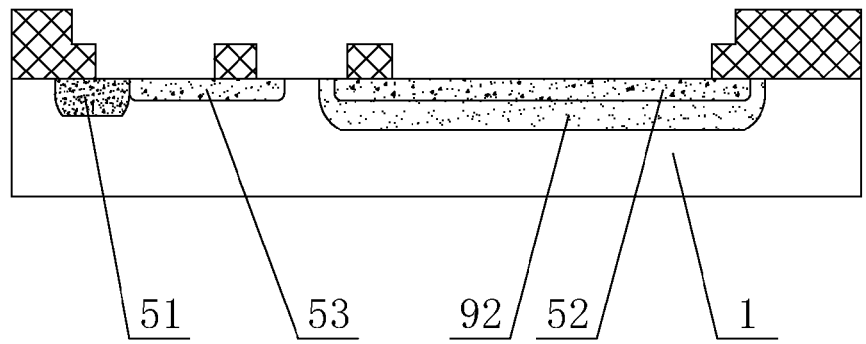
FIGS. 23 and 24: Drawing of the section during step (d) of the high voltage device with constant current source of the embodiment 2.
Figure 24:
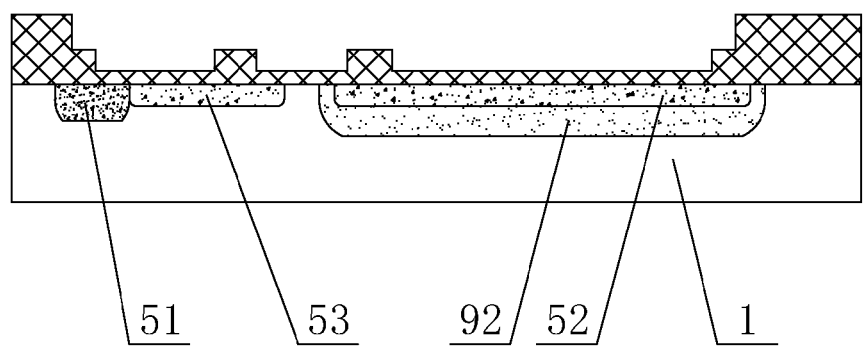
Figure 25:
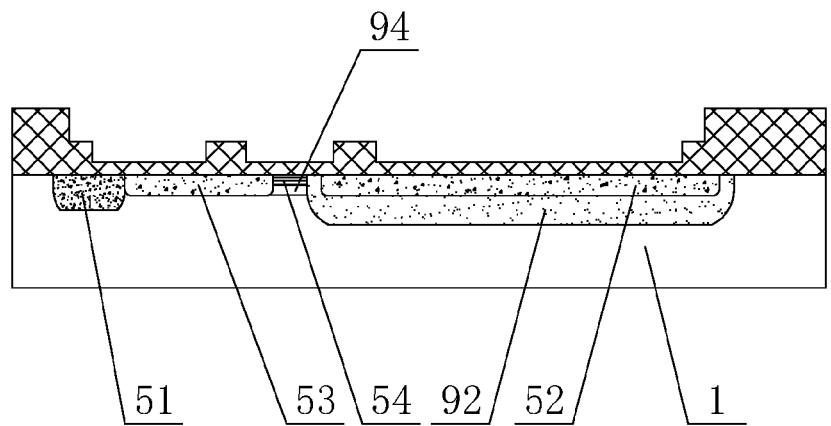
FIG. 25: Drawing of the section after step (e) of the high voltage device with constant current source of the embodiment 2.
Figure 26:
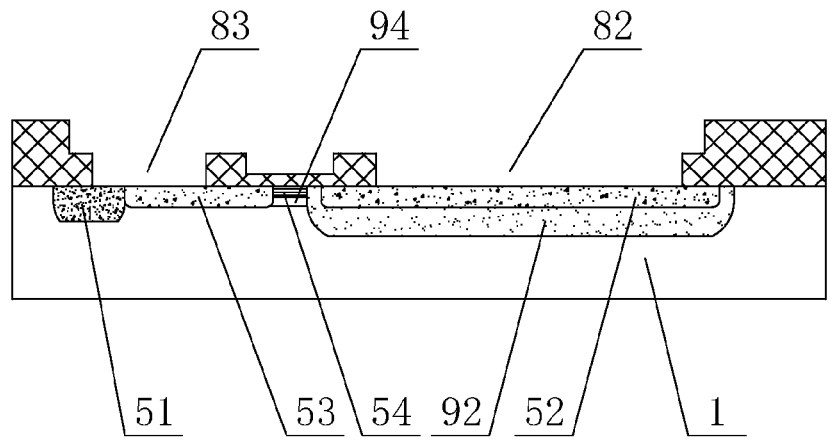
FIGS. 26 and 27: Drawing of the section during step (f) of the high voltage device with constant current source of the embodiment 2.
Figure 27:
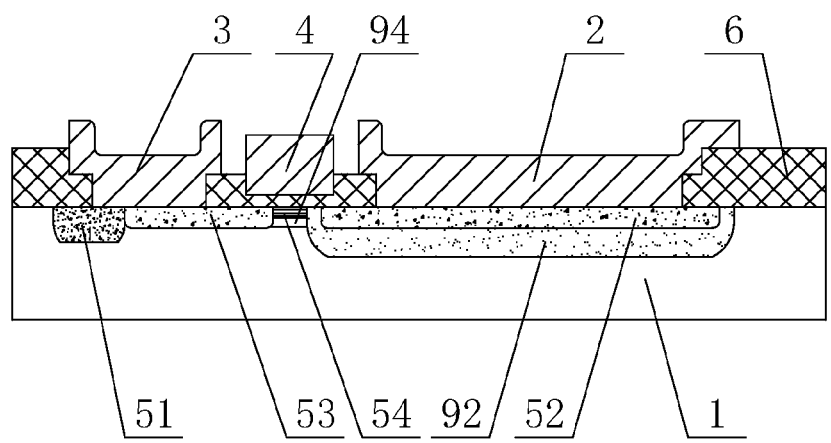

As shown in FIGS. 18-27, the method of manufacturing the high voltage device with constant current source of this Embodiment 2 is different from that of Embodiment 1 in step (b). For this embodiment 2, the step (b) is as follows: Formation of N+drain region, N+source region, N−drain region and N−source region: Executing photoetching on the photoetching machine with the first N+photomask; etching the first oxide layer with corrosive liquid with HF; implanting $1 \times 10^{13} \sim 5 \times 10^{15}/cm^2$ N type impurity phosphorus in the silicon substrate 1 through ion implantation with an energy of 40-160 keV as shown in FIG. 19, or doping phosphorus on the front face of the silicon substrate 1 in high temperature diffusion furnace; then executing photoetching on the photoetching machine with the second N+photomask; next, etching the first oxide layer with corrosive liquid with HF; implanting $1 \times 10^{15} - 1 \times 10^{16}/cm^2$ N type impurity arsenic ion in the silicon substrate 1 through ion implanter with an energy of 40-100 keV as shown in FIG. 20; driving the phosphorus and arsenic ion under 1000~1200° C. to form, for the diffusion velocity of the phosphorus is faster than that of arsenic ion while the quantity is more than that of arsenic ion, N+drain region 52, N+source region 53 and N−drain region 92 so as to improve the withstand voltage between the drain and the source. the N−drain region 92 is controlled with a depth of 3-10 microns; meanwhile forming the second oxide layer which is 2000~8000 Å in thickness; finally, the section is illustrated in FIG. 21.

Embodiment 2 is same as Embodiment 1 for other characteristics.

The invention can be applied to electronic field extensively.

I claim:

1. A high voltage device with constant current source, comprising: a P type silicon substrate (1), an oxide layer (6) formed on the front face of the said silicon substrate (1), a drain metal (2), a source metal (3) and a gate metal (4) which are formed on the front face of the said oxide layer (6); wherein it is further composed of a P+substrate contact region (51), an N+drain region (52) and an N+source region (53) which are implanted in the said silicon substrate (1), an N−channel region (54) connected between the said N+drain region (52) and N+source region (53), an N−drain region (92) enveloping the said N+drain region (52); several drain through holes (82) and source through holes (83) are formed on the said oxide layer (6); the said drain metal (2) fills the drain through holes (82) and connects the said N+drain region (52); the said source metal (3) fills the source through holes (83) and connects the said N+source region (53) and P+substrate contact region (51) respectively; the said source metal (3) and gate metal (4) are electrically connected by connecting metal (34), the drain metal (2) and the source metal (3) and the gate metal (4) are in the same plane, the gate metal (4) is disposed covering above a border of the N+drain region (52), the N−drain region (92) and the N+source region (53).

2. The high voltage device with constant current source according to claim 1, further including an N−source region (93) enveloping the said N+source region (53), the gate metal (4) is disposed covering above a border of the N−source region (93).

3. The high voltage device with constant current source according to claim 1, further including a P+channel protective region (94) separating the said N−channel region (54) and silicon substrate (1).

4. The high voltage device with constant current source according to claim 2, further including a P+channel protective region (94) separating the said N−channel region (54) and silicon substrate (1).

5. The high voltage device with constant current source according to claim 1, further including a heat sink plane (7) made of at least one metal layer(s) on a back of the silicon substrate (1).

6. The high voltage device with constant current source according to claim 2, further including a heat sink plane (7) made of at least one metal layer(s) on a back of the silicon substrate (1).

7. The high voltage device with constant current source according to claim 1, wherein said drain metal (2), source metal (3) and gate metal (4) are made of aluminum, copper or silicon aluminum alloy.

8. The high voltage device with constant current source according to claim 2, wherein said drain metal (2), source metal (3) and gate metal (4) are made of aluminum, copper or silicon aluminum alloy.

9. A method of manufacturing the high voltage device with constant current source according to claim 1, comprising the steps of:
   (a) formation of an oxide layer protection film: conducting thermal oxidation of a P type silicon substrate (1) in an oxidation furnace through wet oxidation to grow a first oxide layer with a thickness of 1000-3000 Å, so as to form the oxide layer protection film;
   (b) formation of the N+drain region (52), the N+source region (53) and the N−drain region (92): executing photoetching on a photoetching machine with a first N+photomask; etching the first oxide layer with corrosive liquid HF; implanting the impurity phosphorus on the front face of the silicon substrate (1) in a high temperature diffusion furnace or implanting the impurity phosphorus in the silicon substrate (1) through ion implantation; executing photoetching on the photoetching machine with a second N+photomask; etching the first oxide layer with corrosive liquid HF; implanting arsenic ions in said silicon substrate (1) through ion implantation; driving the impurity phosphorus and arsenic ions under high temperature to form, due to the different diffusion velocity of the impurity phosphorus and arsenic ions, the N+drain region (52) and N+source region (53) formed of the arsenic ions, and the N−drain region (92) is formed of the impurity phosphorus; and forming a second oxide layer;
   (c) formation of the P+substrate contact region (51): executing photoetching on the photoetching machine with a P+photomask; etching the first and second oxide layers with corrosive liquid HF; implanting boron ions or boron difluoride impurity in the silicon substrate (1) through ion implantation; then driving in the boron difluoride impurity or boron ions under high temperature to form said P+substrate contact region (51); and forming a third oxide layer;
   (d) formation of gate oxide layer: executing photoetching on the photoetching machine with a gate oxide layer photomask; etching the first, second and third oxide layers with corrosive liquid HF; conducting thermal oxidation of said silicon substrate (1) in an oxidation furnace through dry or wet oxidation to grow a fourth oxide layer with a thickness of 500-2000 Å, so as to form the gate oxide layer;
   (e) formation of the N−channel region (54): implanting phosphorus ions in the silicon substrate (1) between N+drain region (52) and N+source region (53) through ion implantation; then tempering to form said N−channel region (54);
   (f) formation of a metal layer: executing photoetching on the photoetching machine with a contact hole photomask; etching the fourth oxide layer to form said drain through hole (82) and source through hole (83); then depositing the metal layer by sputtering or vapour deposition to fill said drain through hole (82) and source through hole (83); next photoetching on the photoetching machine with a metal layer photomask; etching the metal layer to form said drain metal (2), source metal (3), gate metal (4) and connecting metal (34).

10. The method of manufacturing the high voltage device with constant current source according to claim 9, wherein the high voltage device with constant current source further comprises a P+channel protective region (94) separating the said N−channel region (54) and silicon substrate (1); and In said step (e), firstly implanting boron ion in the silicon substrate (1) between N+drain region (52) and N+source region (53) through ion implantation;

then implanting the phosphorus in the silicon substrate (1) between N+drain region (52) and N+source region (53) through ion implantation; finally tempering to form said N−channel region (54) and P+channel protective region (94).

11. A method of manufacturing the high voltage device with constant current source according to claim 2, comprising the steps of:

(a) formation of an oxide layer protection film: conducting thermal oxidation of a P type silicon substrate (1) in an oxidation furnace through wet oxidation to grow a first oxide layer with a thickness of 1000-3000 Å, so as to form the oxide layer protection film;

(b) formation of the N+drain region (52), the N+source region (53) and the N−drain region (92): executing photoetching on a photoetching machine with a first N+photomask; etching the first oxide layer with corrosive liquid HF; implanting the impurity phosphorus on the front face of the silicon substrate (1) in a high temperature diffusion furnace or implanting the impurity phosphorus in the silicon substrate (1) through ion implantation; executing photoetching on the photoetching machine with a second N+photomask; etching the first oxide layer with corrosive liquid HF; implanting arsenic ions in said silicon substrate (1) through ion implantation; driving the impurity phosphorus and arsenic ions under high temperature to form, due to the different diffusion velocity of the impurity phosphorus and arsenic ions, the N+drain region (52) and N+source region (53) formed of the arsenic ions, and the N−drain region (92) is formed of the impurity phosphorus; and forming a second oxide layer;

(c) formation of the P+substrate contact region (51): executing photoetching on the photoetching machine with a P+photomask; etching the first and second oxide layers with corrosive liquid HF; implanting boron ions or boron difluoride impurity in the silicon substrate (1) through ion implantation; then driving in the boron difluoride impurity or boron ions under high temperature to form said P+substrate contact region (51); and forming a third oxide layer;

(d) formation of gate oxide layer: executing photoetching on the photoetching machine with a gate oxide layer photomask; etching the first, second and third oxide layers with corrosive liquid HF; conducting thermal oxidation of said silicon substrate (1) in an oxidation furnace through dry or wet oxidation to grow a fourth oxide layer with a thickness of 500-2000 Å, so as to form the gate oxide layer;

(e) formation of the N−channel region (54): implanting phosphorus ions in the silicon substrate (1) between N+drain region (52) and N+source region (53) through ion implantation; then tempering to form said N−channel region (54);

(f) formation of a metal layer: executing photoetching on the photoetching machine with a contact hole photomask; etching the fourth oxide layer to form said drain through hole (82) and source through hole (83); then depositing the metal layer by sputtering or vapour deposition to fill said drain through hole (82) and source through hole (83); next photoetching on the photoetching machine with a metal layer photomask; etching the metal layer to form said drain metal (2), source metal (3), gate metal (4) and connecting metal (34).

12. The method of manufacturing the high voltage device with constant current source according to claim 11, wherein the high voltage device with constant current source further comprises a P+channel protective region (94) separating the said N−channel region (54) and silicon substrate (1); and In said step (e), firstly implanting boron ion in the silicon substrate (1) between N+drain region (52) and N+source region (53) through ion implantation;

then implanting the phosphorus in the silicon substrate (1) between N+drain region (52) and N+source region (53) through ion implantation; finally tempering to form said N−channel region (54) and P+channel protective region (94).

13. The method of manufacturing the high voltage device with constant current source according to claim 9, wherein on the back of the silicon substrate (1) there is a heat sink plane (7) made of at least one metal layer(s); and further including step (g): formation of a heat sink plane: firstly reducing the thickness of the silicon substrate (1) by grinding the back; then depositing an aluminum metal layer or several metal layers containing titanium, nickel and silver by sputtering or vapor deposition on the back of the silicon substrate (1), so as to form the heat sink plane (7).

14. The method of manufacturing the high voltage device with constant current source according to claim 10, wherein on the back of the silicon substrate (1) there is a heat sink plane (7) made of at least one metal layer(s); and further including step (g): formation of a heat sink plane: firstly reducing the thickness of the silicon substrate (1) by grinding the back; then depositing an aluminum metal layer or several metal layers containing titanium, nickel and silver by sputtering or vapor deposition on the back of the silicon substrate (1), so as to form the heat sink plane (7).

15. The method of manufacturing the high voltage device with constant current source according to claim 11, wherein on the back of the silicon substrate (1) there is a heat sink plane (7) made of at least one metal layer(s); and further including step (g): formation of a heat sink plane: firstly reducing the thickness of the silicon substrate (1) by grinding the back; then depositing an aluminum metal layer or several metal layers containing titanium, nickel and silver by sputtering or vapor deposition on the back of the silicon substrate (1), so as to form the heat sink plane (7).

16. The method of manufacturing the high voltage device with constant current source according to claim 12, wherein on the back of the silicon substrate (1) there is a heat sink plane (7) made of at least one metal layer(s); and further including step (g): formation of a heat sink plane: firstly reducing the thickness of the silicon substrate (1) by grinding the back; then depositing an aluminum metal layer or several metal layers containing titanium, nickel and silver by sputtering or vapor deposition on the back of the silicon substrate (1), so as to form the heat sink plane (7).

\* \* \* \* \*

UNITED STATES PATENT AND TRADEMARK OFFICE
CERTIFICATE OF CORRECTION

PATENT NO.         : 8,169,029 B2
APPLICATION NO.    : 12/490992
DATED              : May 1, 2012
INVENTOR(S)        : Wei-Kuo Wu

It is certified that error appears in the above-identified patent and that said Letters Patent is hereby corrected as shown below:

ON THE TITLE PAGE:

Item (73) Assignee: should read - Nanker (Guang Zhou) Semiconductor Manufacturing Corp., Guang Zhou City (CN) -

Signed and Sealed this
Twenty-sixth Day of June, 2012

David J. Kappos
*Director of the United States Patent and Trademark Office*